(12) United States Patent
Sreeram et al.

(10) Patent No.: US 11,594,265 B1
(45) Date of Patent: Feb. 28, 2023

(54) APPARATUS INCLUDING PARALLEL PIPELINE CONTROL AND METHODS OF MANUFACTURING THE SAME

(71) Applicant: Micron Technology, Inc., Boise, ID (US)

(72) Inventors: Navya Sri Sreeram, Plano, TX (US);
Kallol Mazumder, Dallas, TX (US);
Ryo Fujimaki, Sagamihara (JP);
Kazutaka Miyano, Sagamihara (JP);
Yutaka Uemura, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/466,052

(22) Filed: Sep. 3, 2021

(51) Int. Cl.
*G11C 7/10* (2006.01)
*G11C 7/22* (2006.01)
*G11C 11/4076* (2006.01)
*G11C 11/4096* (2006.01)
*G11C 8/18* (2006.01)

(52) U.S. Cl.
CPC .......... *G11C 7/1006* (2013.01); *G11C 7/109* (2013.01); *G11C 7/222* (2013.01); *G11C 11/4076* (2013.01); *G11C 11/4096* (2013.01); *G11C 8/18* (2013.01)

(58) Field of Classification Search
CPC ....... G11C 7/1006; G11C 7/109; G11C 7/222; G11C 11/4076; G11C 11/4096; G11C 8/18
See application file for complete search history.

(56) References Cited

U.S. PATENT DOCUMENTS

| | | | | |
|---|---|---|---|---|
| 8,208,340 | B2* | 6/2012 | Fujisawa | G11C 7/02 365/236 |
| 8,295,119 | B2* | 10/2012 | Fujisawa | G11C 11/4094 365/221 |
| 8,576,656 | B2* | 11/2013 | Fujisawa | G11C 11/4076 365/189.08 |
| 9,054,713 | B2* | 6/2015 | Kitagawa | G11C 7/222 |
| 10,254,782 | B2* | 4/2019 | He | G11C 7/222 |
| 10,403,340 | B2* | 9/2019 | Komatsu | G11C 7/1066 |
| 2021/0103407 | A1* | 4/2021 | Na | G11C 7/222 |
| 2021/0134336 | A1* | 5/2021 | Na | G11C 29/028 |

* cited by examiner

*Primary Examiner* — Tri M Hoang
(74) *Attorney, Agent, or Firm* — Perkins Coie LLP

(57) ABSTRACT

Methods, apparatuses, and systems related to coordinating a set of timing-critical operations across parallel processing pipelines are described. The coordination may include selectively using (1) circuitry associated with a corresponding pipeline to generate enable signals associated with the timing critical operations when a separation between the operations corresponds to a number of pipelines or (2) circuitry associated with a non-corresponding or another pipeline when the separation is not a factor of the number of pipelines.

20 Claims, 8 Drawing Sheets

APPARATUS INCLUDING PARALLEL PIPELINE CONTROL AND METHODS OF MANUFACTURING THE SAME

TECHNICAL FIELD

The disclosed embodiments relate to apparatuses, and, in particular, to semiconductor devices with a mechanism for managing data pipelines.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the semiconductor devices are being pushed to the limit with various improvements. Improving devices, generally, may include increasing circuit density, increasing operating speeds or otherwise reducing operational latency, increasing reliability, increasing data retention, reducing power consumption, or reducing manufacturing costs, among other metrics. However, such improvements can often introduce challenges in subsequent data processing (e.g., such as due to decrease in time windows to achieve targeted transitions) and can create sources of error in data transfers if not handled appropriately.

DETAILED DESCRIPTION

Figure 1:
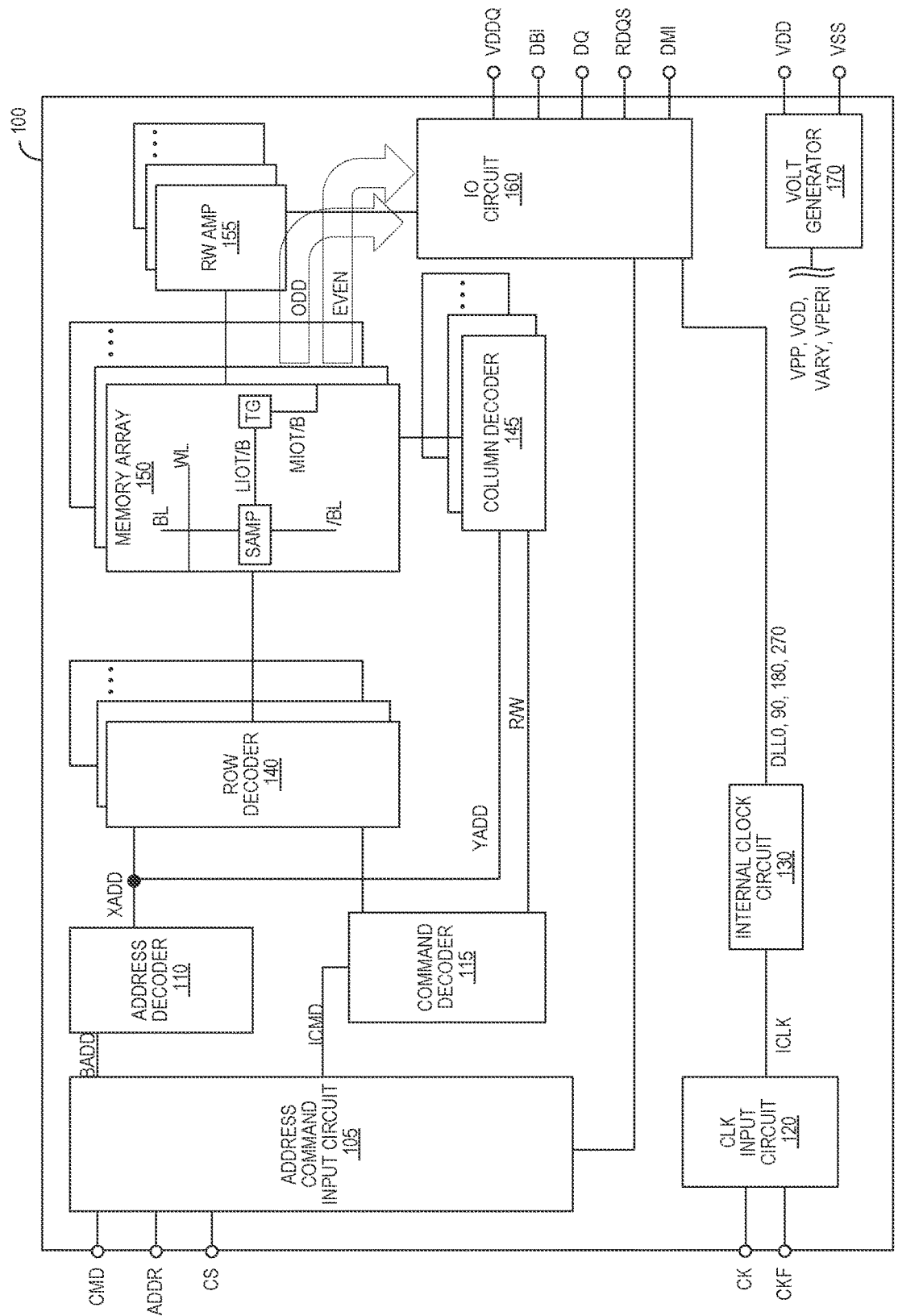
FIG. 1 is a block diagram of an apparatus in accordance with an embodiment of the present technology.

As described in greater detail below, the technology disclosed herein relates to an apparatus, such as for memory systems, systems with memory devices, related methods, etc., for managing parallel pipelines. The apparatus (e.g., a memory device and/or system including the memory device) can include a set of parallel data processing paths/circuits. The parallel circuit paths can operate according to corresponding internal clocks that have a reduced frequency relative to external clock(s). The apparatus can include a coordination circuit to account for any loss in granularity caused by the reduced frequencies of the internal clocks, such when operations are timed/delayed based on odd number of pulses. In some embodiments, the coordination circuit can generate the control signals using one or more non-active pipelines to coordinate operations of an active pipeline. When the controls signals are required to be separated by an odd number of external clock pulses, the coordination circuit can use the other (e.g., the non-active) pipeline to effectively introduce a delay of one external clock pulse for a corresponding portion of the operation. The remaining portions of the data processing can remain with the active pipeline.

As an illustrative example, a memory device (e.g., a DRAM) can include an even pipeline and an odd pipeline that are each configured to process unique portions of a read data. The communication between the memory device and the host/controller can be coordinated using the external clock, and the even and odd pipelines can be operated using an even clock (e.g., DLL0) and an odd clock (e.g., DLL180), respectively. The internal even and odd clocks can have a frequency that is less than (e.g., half of) the external clock. The parallel pipelines and the reduced internal clocks can provide increased time for the memory device to process the requested data. Accordingly, the parallel pipelines and the internal clocks can reduce errors related to high-frequency data processing, such as data errors/corruption caused by insufficient signal transition time.

Continuing with the illustrative example, the memory device can include a coordination circuit that controls a set of signals, such as for data output (DQS) enable signal (QED) and DQS strobe enable (QES) signals. The coordination circuit can be configured to selectively control a latency or a delay (e.g., a duration required by an overall system and/or a standard) between the coordinated signals. To account for different possible latency durations, the coordination circuit can include circuitry configured to account for latencies corresponding to odd number of external clock pulses between the coordinated signals. In some embodiments, the coordination circuit can use the other pipeline to process a portion of the operation, such as by generating a portion of the coordinated signals (e.g., the QES signal when the latency between the QES and the QED is an odd number of clock pulses, such as one pulse).

Example Apparatus

FIG. 1 is a block diagram of the apparatus 100 (e.g., a semiconductor die assembly, including a 3DI device or a die-stacked package) in accordance with an embodiment of the present technology. For example, the apparatus 100 can include a DRAM (e.g., DDR4 DRAM, DDR5 DRAM, LP DRAM, HBM DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105 (e.g., command circuit), to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock pulses of the CK clock signal. For example, the read latency information RL can be a number of clock pulses of the CK signal after the read command is received by the apparatus 100 when the associated read data is provided.

Write data can be supplied to the data terminals DQ, DBI, and DMI. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1). The write latency WL information can be defined in terms of clock pulses of the CK clock signal. For example, the write latency information WL can be a number of clock pulses of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF can be supplied to a clock input circuit 120 (e.g., external clock circuit). The CK and CKF signals can be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies (e.g., provide IO clock signals at half the frequency of the external clock signal) and/or different phases (e.g., provide IO clock signals phase sifted by 0, 90, 180, and/or 270 degrees from the external clock signal) so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100, although in other embodiments, the host device may be indirectly connected to memory device (e.g., over a networked connection or through intermediary devices).

The apparatus 100 can include an 'N' number of data pipelines configured to process data (e.g., read data and/or write data) in parallel according to internal clock signals having a frequency reduced by a factor of '1/N' in comparison to the external clock (e.g., CK/CKF). The parallel pipelines can be implemented using circuitry across the command/address input circuit 105, the decoders 140/145, the memory array 150, the input/output circuit 160, and/or other circuits described above.

The apparatus 100 can include a coordination circuit (at, e.g., the input/output circuit 160, the command/address input circuit 105, and/or other circuits described above) that controls a set of signals to account for any loss in granularity caused by the reduced internal clock frequencies. For example, in some embodiments, the coordination circuit can control the timing/generation of enable signals, such as the QES and the QED signals. Details of the coordination circuit is further described below.

For illustrative purposes, embodiments of the present technology will be described using the two-pipeline configuration where N=2 and the external clocks correspond to even and odd pulses. However, it is understood that the apparatus may be implemented with any number of pipelines (i.e., N>2).

Parallel Pipeline Operation

Figure 2A:
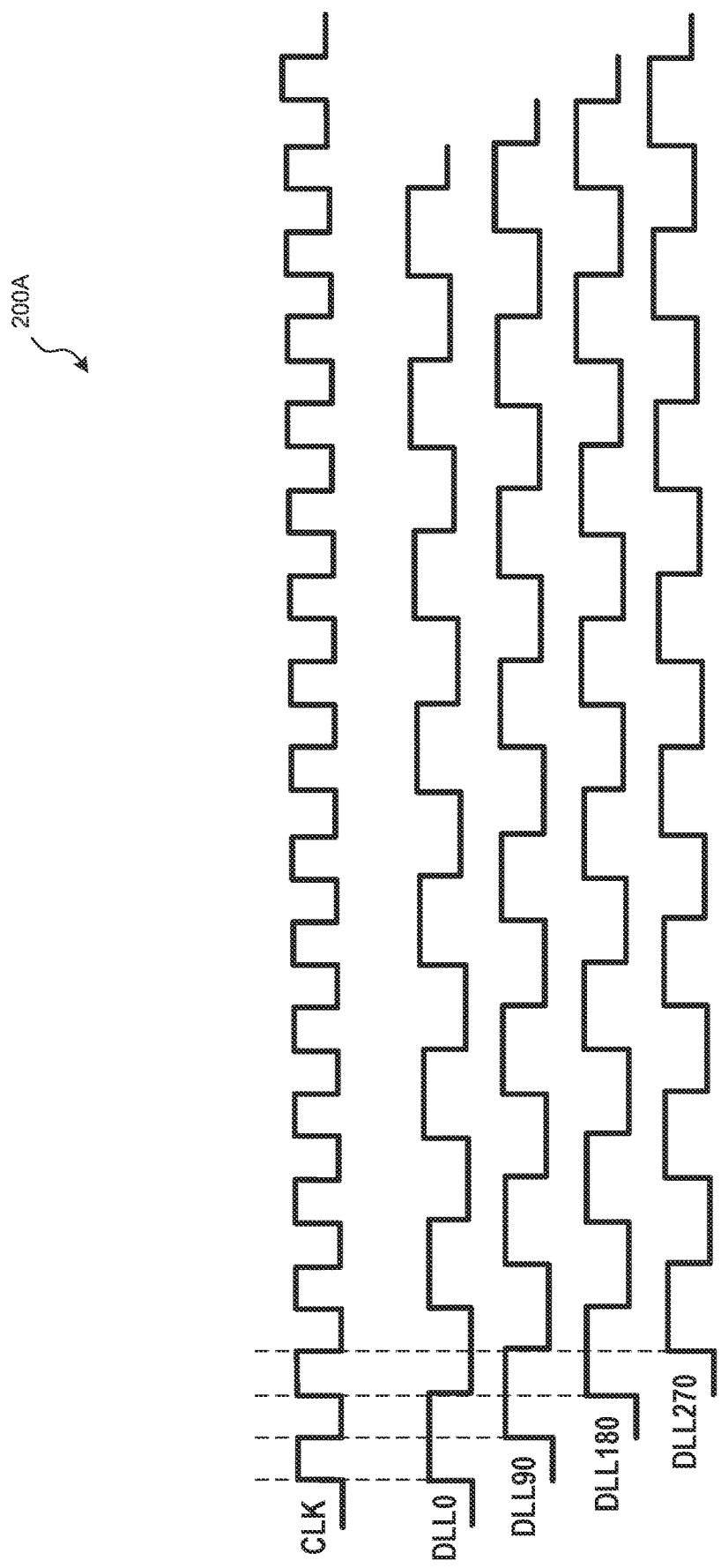
FIGS. 2A-2C illustrate timing diagrams of internal and external clocks in accordance with an embodiment of the present technology.
Figure 2B:
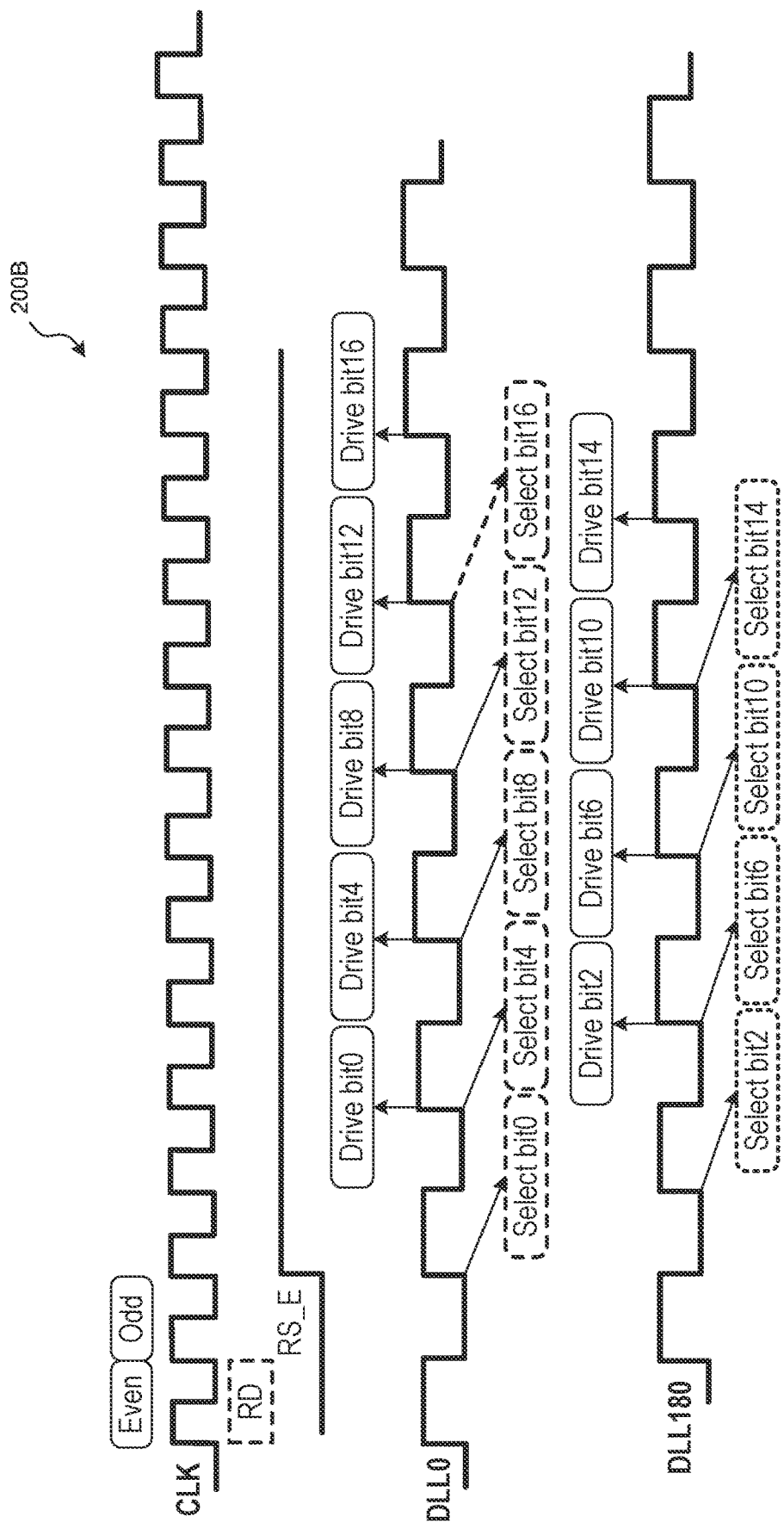
Figure 2C:
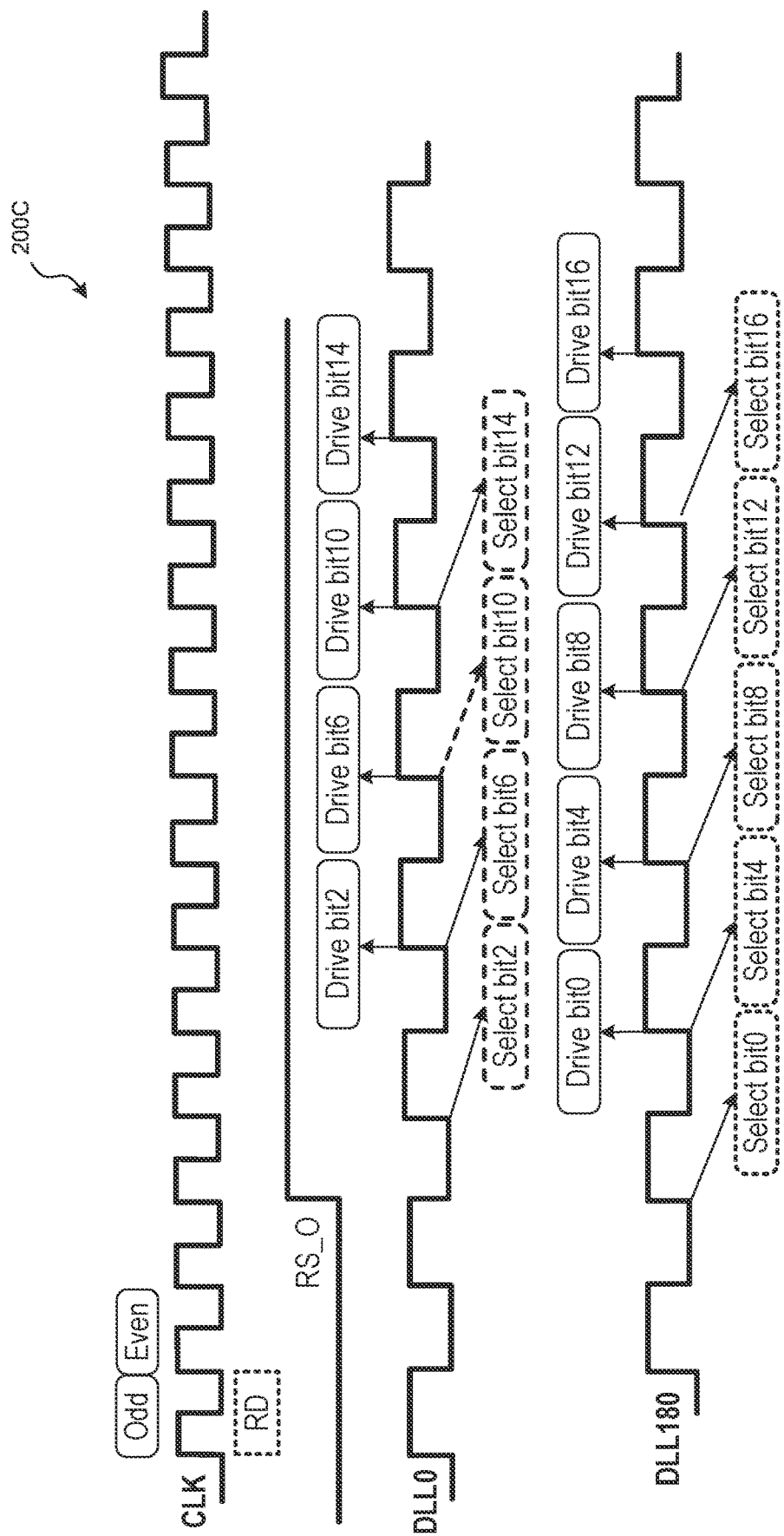

FIGS. 2A-2C illustrate timing diagrams of internal and external clocks in accordance with an embodiment of the present technology. FIG. 2A illustrates a timing diagram 200A of internal clock signals DLL0, DLL90, DLL180, and DLL270 and an external clock signal CLK. The apparatus 100 (via, e.g., the clock input circuit 120 of FIG. 1) can generate the internal clock signals DLL0, DLL90, DLL180, and DLL270 based on phase shifting each signal by 90°. In other words, DLL0 can have a rising edge aligned with a rising edge of a corresponding target clock pulse. DLL90 can be phase shifted from DLL0 by 90°, DLL180 can be phase shifted from DLL90 by 90°, and so forth. Each pulse of the internal clock signals can have longer periods (e.g., lower frequency) in comparison to the external clock signal.

In some embodiments, the apparatus 100 of FIG. 1 can correspond to or include a DDR memory device. The DDR specification may require multiple actions, such as for communicating two information units (e.g., bits), for each pulse of the clock signal. Accordingly, the apparatus 100 can use the different internal clock signals to coordinate and implement the multiple actions for each pulse. For example, the apparatus 100 can use the DLL0 to communicate the first bit and DLL90 to communicate the second bit. The apparatus 100 can use DLL0, DLL90, DLL180, and DLL270 to communicate four bits (e.g., a nibble) and two cycles/periods of the internal clock signals to communicate eight bits (e.g., a word).

FIG. 2B illustrates a timing diagram 200B for processing even commands (e.g., commands received on an even pulse of the external clock). The apparatus 100 of FIG. 1 can identify the external clock signal as a repeating sequence of even and odd clock pulses (e.g., a pattern of N=2 pulses) that respectively correspond to even and odd pipelines. Accordingly, DLL0 and DLL 90 (e.g., corresponding to rising and falling edge of the even clock) can be used to operate the even pipeline, and DLL180 and DLL270 can be used to operate the odd pipeline. While not shown in FIG. 2B, DLL90 and DLL 270 can correspond to falling edges of even and odd pulses, respectively, and can be used to operate the corresponding pipelines.

For the example illustrated in FIG. 2B, the apparatus 100 can receive a read command (RD) on an even clock pulse from an external source. In response, the apparatus 100 can generate an even enable signal RS_E (via, e.g., the address/command circuit 105, the clock input circuit 120, the input-output circuit 160, and/or other circuits described above for FIG. 1). The even enable signal can be configured to operate the even pipeline and/or control timing for the subsequent data processing. For the DDR example, the even enable signal can be used to control the even pipeline to process bits 0, 1, 4, 5, 8, 9, 12, 13, 16, and 17 of the read data. Also, the odd pipeline can process bits 2, 3, 6, 7, 10, 11, 14, and 15 of the read data. In other words, the even pipeline can process a portion of the bits of the stored unit of data, and the odd pipeline can process another portion of the bits of the stored unit of data. The even enable signal can further indicate that the first portion of the output read data is from the even pipeline and/or that DLL0 is used to deliver the first portion of the read data. Portions of the read data can be selected and driven starting with DLL0, and other portions can be sequentially selected and driven according to the other corresponding internal clock signals.

FIG. 2C illustrates a timing diagram 200C for processing odd commands (e.g., commands received on the odd pulse of the external clock). FIG. 2C can correspond to the apparatus 100 of FIG. 1 receiving the read command on an odd pulse in the external clock. In response, the apparatus 100 can generate an odd enable signal RS_O (via, e.g., the address/command circuit 105, the clock input circuit 120, the input-output circuit 160, and/or other circuits described above for FIG. 1). The odd enable signal can be configured to operate the odd pipeline and/or control timing for the subsequent data processing. For the DDR example, the odd enable signal can be used to control the odd pipeline to process bits 0, 1, 4, 5, 8, 9, 12, 13, 16, and 17 of the read data. Also, the even pipeline can process bits 2, 3, 6, 7, 10, 11, 14, and 15 of the read data. The odd enable signal can further indicate that the first portion of the output read data is from the odd pipeline and/or that DLL180 is used to deliver the first portion of the read data. Portions of the read data can be selected and driven starting with DLL180, and other portions can be sequentially selected and driven according to the other corresponding internal clock signals. The odd enable signal and the even enable signal can be mutually exclusive. In some embodiments, the odd and even enable signals may partially overlap.

Example Operation of Coordination Circuit

Figure 3:
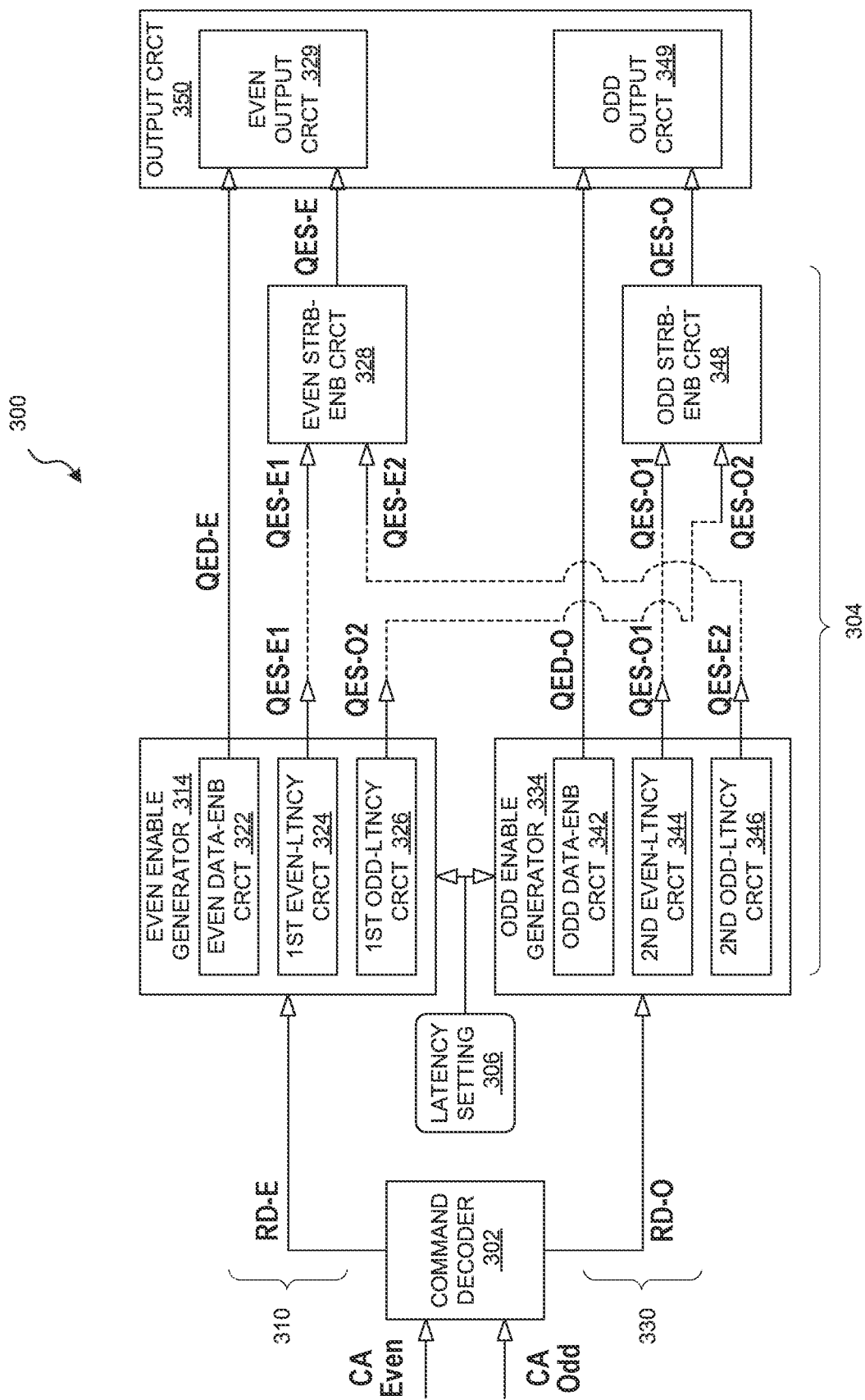
FIG. 3 illustrates a block diagram of an example coordination circuit in accordance with an embodiment of the present technology.

FIG. 3 illustrates a block diagram of an example coordination circuit 300 in accordance with an embodiment of the present technology. The coordination circuit 300 can be configured to control one or more timings in operating the parallel pipelines. In controlling the timing of the operations, the coordination circuit 300 can be configured to coordinate signal offsets or offset timings to account for frequency differences between internal and external clock signals. For illustrative purposes, the coordination circuit 300 is described with respect to processing read outputs. However, it is understood that the coordination circuit 300 can be implemented for other types of commands (e.g., writes) and/or other types of operating environments (e.g., in central processing units (CPUs), graphic processing units (GPUs), modems, digital signal processors (DSPs), interface circuits, or the like).

The coordination circuit 300 can include a command decoder 302 (e.g., the command decoder 115 of FIG. 1) configured to translate commands received from external devices or processing results thereof into internal operating commands. For example, the command decoder 302 can receive a command (e.g., a read command) and a corresponding address (CA). The received command can be identified as even or odd as described above. The command decoder 302 can generate internal commands, such as read-even (RD-E) and/or read-odd (RD-O) commands. The command decoder 302 can provide the internal commands to an even pipeline path 310 and/or an odd pipeline path 330. The even and odd pipeline paths 310 and 330 can each be configured to coordinate read outputs for the corresponding pipelines. In some embodiments, the even and odd pipeline paths 310 and 330 may be mutually exclusive, and only one of either the even pipeline path 310 or the odd pipeline path 330 may be active at one time. In other embodiments, terminal portions (e.g., beginning and/or end portions) of the processing through the even and odd pipeline paths 310 and 330 may overlap each other.

Each pipeline path can include an enable generator configured to coordinate a set of enable signals used to operate corresponding aspects or portions of the associated pipeline. For example, the even pipeline path 310 can include an even enable generator 314 configured to coordinate activation of the even QED (QED-E) and the even QES (QES-E) signals for the even pipeline. Also, the odd pipeline path 330 can include an odd enable generator configured to coordinate activation of the odd QED (QED-O) and the odd QES (QES-O) signals for the odd pipeline.

To control the QED signals, the even enable generator 314 can include an even data-enable circuit 322. The even data-enable circuit 322 can be configured (via, e.g., buffers, drivers, timers, etc.) to generate the QED-E signal used to control or enable the output of the data (DQ) signals. The even data-enable circuit 322 can generate the QED-E based on the even internal clock. In other words, the rising edge of the QED-E can coincide with a rising edge of DLL0. Similarly, the odd enable generator 334 can include an odd data-enable circuit 342 configured to generate the QED-O signal based on the odd internal clock (DLL180).

Furthermore, the enable generators can include circuitry configured to control other enable signals, such as the QES. The generated enables may correspond to timing restrictions associated with certain operations and/or output signals as required by an overall system and/or an industry standard. For example, standards for DDR data rates may require a specific latency or offset between DQS and DQ, thereby dictating the timing between the corresponding QES and QED signals. In other words, the QES may be required to precede the QED by a specific number of external clock pulses.

The required delays or separations may not fully align with the number of parallel pipelines and the corresponding reduction in the internal clock frequencies. For the two-pipeline configuration, separation requirements that correspond to an odd number of external clock pulses may require additional processing. The coordination circuit 300 may include a latency control circuit 304 configured to control and implement the required delays and account for the granularity differences in the internal and external clocks. The latency control circuit 304 may be incorporated with the enable generators.

In some embodiments, the latency control circuit 304 can be configured to utilize a non-activated pipeline to account for the reduced internal clock frequency. For example, the even enable generator 314 can be configured to generate the QES-O for even read commands when the latency corresponds to an odd number of external clock pulses. Also, the odd enable generator 334 can be configured to generate the QES-E for odd read commands for odd number of separation pulses.

To utilize the other pipeline, each of the enable generators can include an even and odd latency circuit (e.g., signal drivers, multiplexers, switch matrices, or the like for providing signals to targeted/selected locations). For example, the even enable generator 314 can include a first even-latency circuit 324 and a first odd-latency circuit 326 that may be selectively activated according to a latency setting 306 (e.g., a predetermined value that corresponds to a number of external clock pulses for the required latency). The first even-latency circuit 324 can be selected to generate the QES-E1 for the even commands/pipeline when the latency corresponds to an even number of pulses. The first odd-latency circuit 326 can be selected to generate the QES-O2 (e.g., an odd QES signal/enable for DQS) for the even commands when the latency corresponds to an odd number of pulses. Both the first even-latency circuit 324 and the first odd-latency circuit 326 can generate the corresponding QES signal according to the even internal clock (e.g., DLL0). The even enable generator 314 can generate the QES-O2 and leverage the odd pipeline/clock to provide the one clock offset corresponding to the odd number of latency cycles for the even command.

Similar to the even enable generator 314, the odd enable generator 334 can include a second even-latency circuit 344 and a second odd-latency circuit 346 that may be selectively activated according to the latency setting 306. The second even-latency circuit 344 can be selected to generate the QES-O1 for the odd commands/pipeline when the latency corresponds to an even number of pulses. The second odd-latency circuit 346 can be selected to generate the QES-E2 (e.g., an even QES signal/enable for DQS) for the odd commands when the latency corresponds to an odd number of pulses. Both the second even-latency circuit 344 and the second odd-latency circuit 346 can generate the corresponding QES signal according to the odd internal clock (e.g., DLL180). The odd enable generator 334 can generate the QES-E2 and leverage the even pipeline/clock to provide the one clock offset corresponding to the odd number of latency cycles for the odd command.

The coordination circuit 300 can include circuits to combine or harmonize the different QES signals. For example, the coordination circuit 300 can include an even strobe-enable circuit 328 configured to combine the QES-E1 and the QES-E2 signals and generate a QES-E signal as a combined result. Since only one of the QES-E1 and the QES-E2 will be active per received command, the even strobe-enable circuit 328 (e.g., a multiplexer, an OR gate, or the like) can selectively let the incoming signal pass through as the QES-E output. The coordination circuit 300 can similarly include an odd strobe-enable circuit 348 (e.g., a multiplexer, an OR gate, or the like) configured to combine the QES-O1 and the QES-O2 signals to generate a QES-O signal.

The combined QES outputs can each be provided to an output circuit of a corresponding pipeline. For example, the QES-E from the even strobe-enable circuit 328 can be provided to an even output circuit 329, and the QES-O from the odd strobe-enable circuit 348 can be provided to an odd output circuit 349. The even output circuit 329 can correspond to a portion of an output circuit 350 (e.g., an output portion of the input output circuit 160 of FIG. 1) associated with the even pipeline. The odd output circuit 349 can correspond to a portion of the output circuit 350 associated with the odd pipeline. The provided QES signal can be used to generate the DQS signal. The even and odd output circuits 329 and 349 can also receive the corresponding QED signals and generate the DQ outputs from the pipelines. The QED-E can coordinate the initial portion of the read data to be transmitted from the even pipeline, and the QED-O can coordinate the initial portion of the read data to be transmitted from the odd pipeline.

Figure 4:
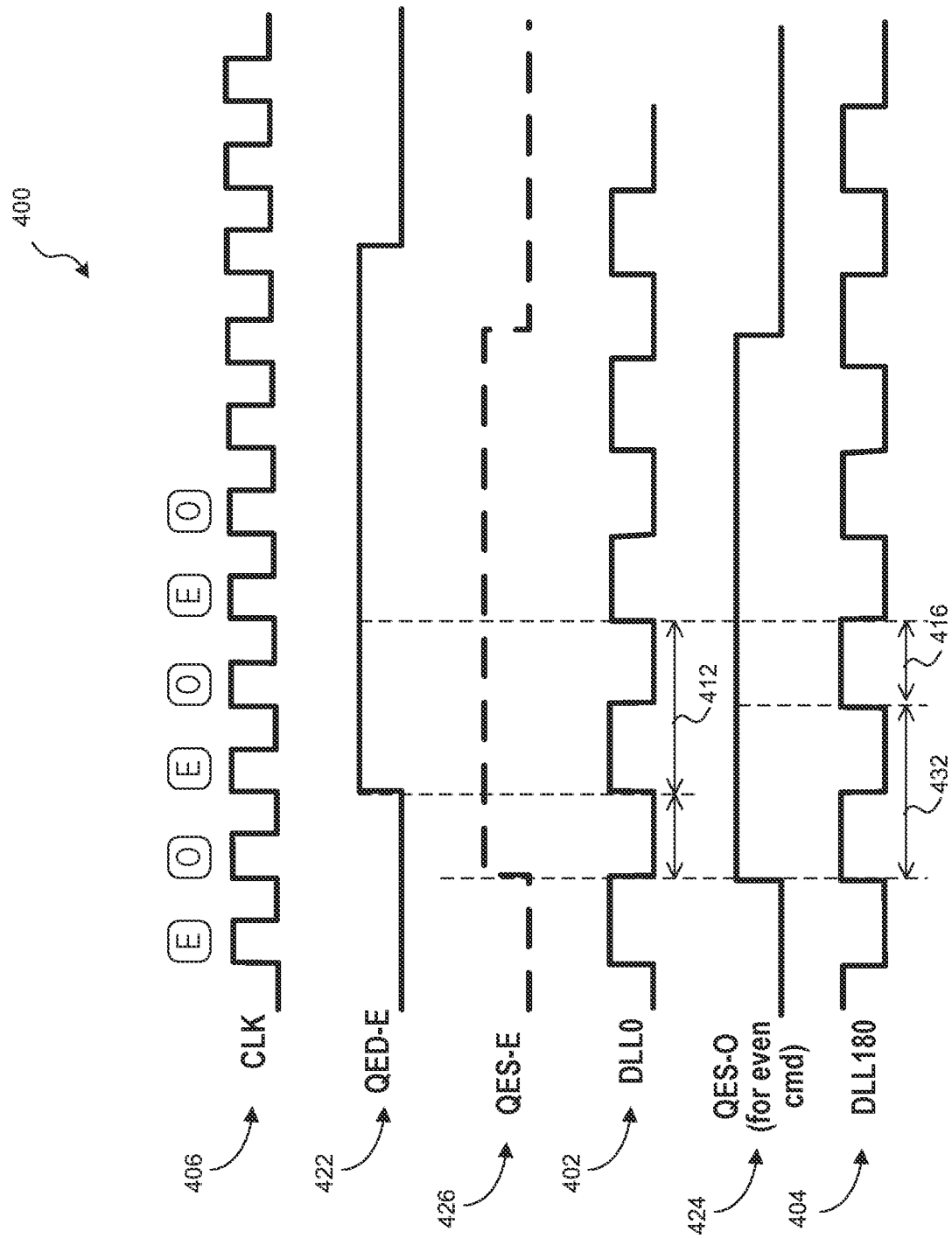
FIG. 4 illustrates a timing diagram of coordinated signals in accordance with an embodiment of the present technology.

As an example of the coordinated output, FIG. 4 illustrates a timing diagram 400 of coordinated signals (e.g., the QED and QES signals) in accordance with an embodiment of the present technology. The example illustrated in FIG. 4 corresponds to a response to a read command received on an even clock pulse. As such, the initial portion of the read data can be obtained and sent through the even pipeline as described above.

In some embodiments, the apparatus 100 of FIG. 1 can generate and use an even clock 402 (e.g., an internal signal, such as DLL0) and an odd clock 404 (e.g., a phase-shifted internal signal, such as DLL180) to coordinate data processing across the corresponding even and odd pipelines. The even and odd clocks 402 and 404 can be aligned with alternating pulses in an external clock 406 and have frequencies that are half of the frequency of the external clock 406.

The apparatus 100 can include the coordination circuit 300 of FIG. 3 that selectively use the internal clocks (e.g., either the even clock 402 or the odd clock 404) to generate coordination signals (e.g., QED and QES signals) as described above. For the illustrated example, the coordination circuit 300 can be configured to implement a signal separation 416 (e.g., a delay corresponding to the latency setting 306 of FIG. 3) that covers an odd number of external clock pulses (e.g., one pulse). In other words, the coordination circuit 300 may be required to generate the strobe or the preamble (DQS) preceding the read data (DQ) by at least one external clock pulse. Also, the output circuit 350 of FIG. 3 can be configured to implement a data latency requirement 412 (e.g., an even number of external clock pulse, such as two) between a second coordination signal 422 (e.g., the QED-E for the even read command example) and the actual response, such as for outputting the read data (e.g., DQ).

Based on the odd number of pulses separating the DQS and DQ, the coordination circuit 300 can select the first odd-latency circuit 326 of FIG. 3 (e.g., a circuit associated with the even enable generator 314 of FIG. 3) to generate a first coordination signal 424 (e.g., the QES-O). In other words, the even pipeline can use the even enable generator 314 to leverage the odd pipeline/clock for QES/DQS. Since the first coordination signal 424 aligns with the other clock (e.g., the odd clock 404) that is naturally shifted by one pulse from the targeted clock (e.g., the even clock 402 targeted for operating the even pipeline in response to the even read command), the apparatus 100 can use a response delay 432 that matches a full cycle of the internal clock (e.g., for the odd clock 404).

In alternative embodiments, the apparatus 100 may process all aspects of the command (e.g., the read command) within the corresponding pipeline (e.g., the even pipeline). In such case, the apparatus 100 can generate a matching coordination signal 426 (e.g., a signal aligning with the QES-E1 of FIG. 3) using the even pipeline (e.g., similar to the even enable generator 314 of FIG. 3). The even pipeline may be limited to generating the matching coordination signal 426 and/or the response (e.g., the DQS) according to the even clock 402. As such, the apparatus 100 may include special circuitry to capture the QES signal within a margin of one external clock pulse, time operations based on a falling edge of the even clock 402, and/or time operations based on a shifted internal clock (e.g., DLL90).

In comparison to the alternative embodiments, the latency control circuit 304 configured to selectively utilize circuits associated with other/non-targeted pipelines provides flexibility to adapt to different separation or latency requirements between operations. The latency control circuit 304 can allow the apparatus 100 to delay operations by odd number of pulses (e.g., a duration incongruent with internal clock frequencies) while maintaining timing margins for the internal processing. Moreover, the latency control circuit 304 can provide the required granularity using existing circuitry (e.g., circuits/clocks associated with the other pipeline) or minimal additional circuitry (e.g., cross-over coordination circuitry, such as the odd-latency circuits).

Example Process Flow

Figure 5:
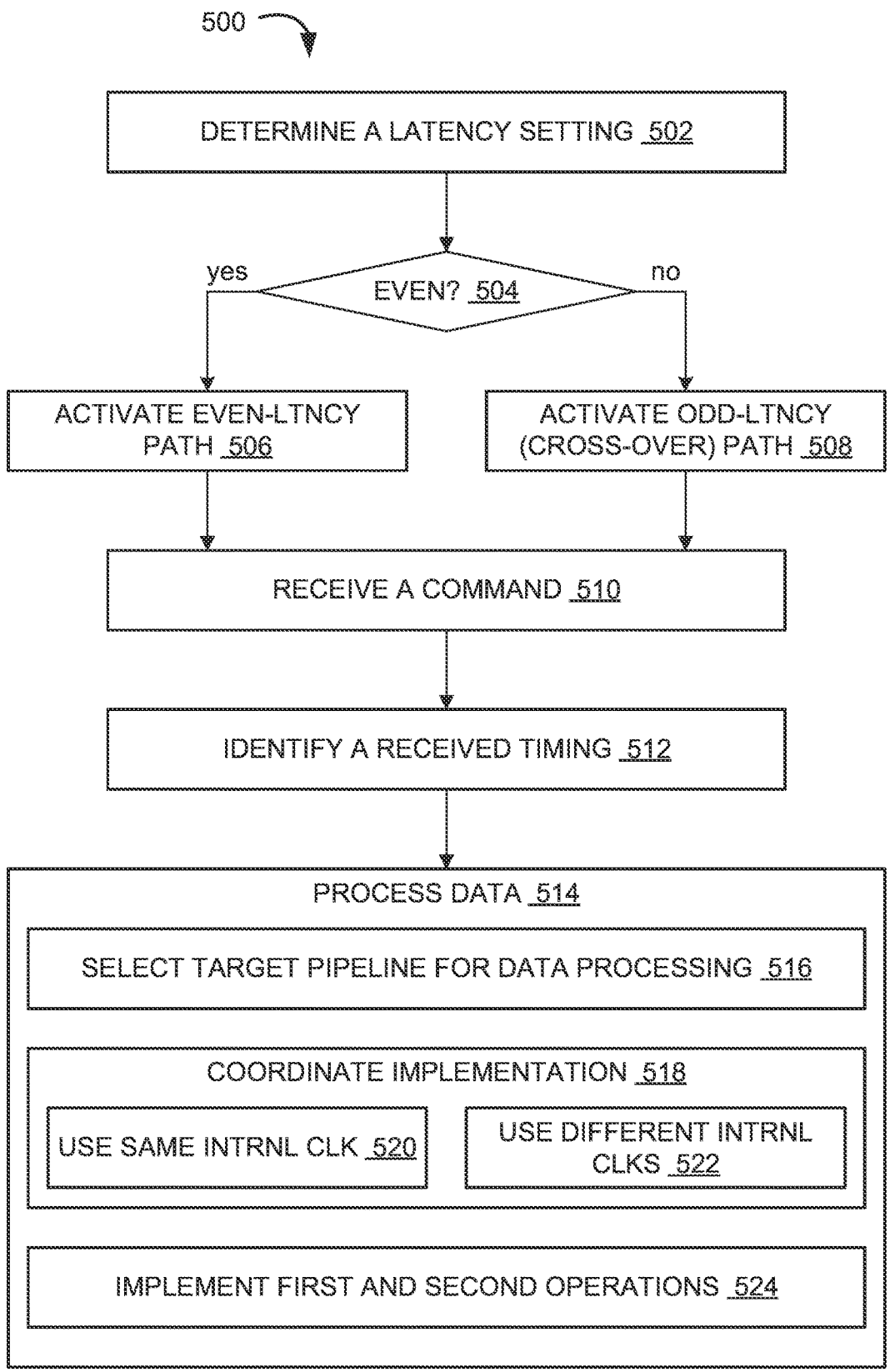
FIG. 5 is a flow diagram illustrating an example method of operating an apparatus in accordance with an embodiment of the present technology.

FIG. 5 is a flow diagram illustrating an example method 500 of operating an apparatus (e.g., the apparatus 100 of FIG. 1) in accordance with an embodiment of the present technology. The method 500 can be for selectively controlling a delay between operations (e.g., DQ and DQS). The method 500 can correspond to any of the circuits (e.g., the coordination circuit 300 of FIG. 3) and/or the timing diagrams (e.g., the timing diagram 400 of FIG. 4) described above.

At block 502, the apparatus 100 can determine a latency setting (e.g., the latency setting 306). The apparatus 100 can access a predetermine memory location (e.g., a fuse setting) to determine the latency setting and the corresponding signal separation 416 of FIG. 4.

At decision block 504, the apparatus 100 can determine whether the determined latency corresponds to an even number of external clock pulses (e.g., if the latency corresponds to a factor of a quantity of pipelines). For example, the apparatus 100 can divide the number of pulses associated with the latency setting 306 or the corresponding signal separation 416 by N to see if the remainder is greater than 0. If the remainder is 0, the apparatus 100 can determine that the latency is even or a multiple of N (e.g., the number of pipelines in the apparatus 100). Otherwise, the apparatus 100 can determine that the latency is odd.

The apparatus 100 can select and activate a circuit path according to the even/odd determination. In some embodiments, the available circuit paths can include the even-latency and odd-latency circuits, such as for N=2, that are each configured to generate an enable signal (e.g., QES and QED) for implementing one of the first and second operations (e.g., generating either the DQS or the DQ stream) according to the internal clock associated with the corresponding pipeline.

At block 506, the apparatus 100 can select and activate an even-latency path (e.g., the first even-latency circuit 324 of FIG. 3 and/or second even-latency circuit 344 of FIG. 3) when the latency setting 306 corresponds to an even number of pulses for the external clock. The even-latency path can be activated and/or route the enable signals along the corresponding pipeline (e.g., the even pipeline for even commands or the odd pipeline for odd commands). For example, when the signal separation 416 corresponds to an even number of external clock pulses, the apparatus 100 can select even-latency path that delivers (1) enable signals associated with the even enable clock to the even pipeline and (2) enable signals associated with the odd enable clock to the odd pipeline.

Otherwise, at block 508, the apparatus 100 can activate paths/circuits (e.g., the first odd-latency circuit 326 of FIG. 3 and the second odd-latency circuit 346 of FIG. 3) associated with odd latency when the latency setting 306 corresponds to an odd number of pulses. The odd-latency path can be selected to activate and/or route one or more of the enable signals across complementary pipelines. In other words, the first odd-latency circuit 326 can be selected to provide the QES-O2 aligned with the even enable clock to the odd pipeline, and the second odd-latency circuit 346 can be selected to provide the QES-E2 aligned with the odd enable clock to the even pipeline.

At block 510, the apparatus 100 can receive a command during operation (e.g., after the latency setting 306 is set/determined). The received command can be for processing and/or communicating data between circuits. For example, the received command can include a read command for a memory (e.g., a DDR-based DRAM).

At block 512, the apparatus 100 can identify a received timing of the command. As described above, the apparatus 100 can identify the received timing as a position within a repeating pattern of N-pulses for the external clock. For the even and odd pipeline embodiment, the apparatus 100 (via, e.g., the address command input circuit 105, the command decoder 115, the clock input circuit, and/or other circuits describe above for FIG. 1) can determine whether the command was aligned with an even clock pulse or an odd clock pulse of the external clock.

At block 514, the apparatus 100 can process the data according to the received timing. The apparatus 100 can process non-overlapping portions of the data in parallel across the pipelines. Accordingly, the data can be processed at a slower speed according to an internal clock that has a frequency that is 1/N of the frequency of the external clock.

At block 516, the apparatus 100 can select a target pipeline according to the identified timing. For example, the apparatus 100 can select the even pipeline for processing the command aligned with the even clock (e.g., the even command) or select the odd pipeline for processing the command aligned with the odd clock (e.g., the odd command). The selected pipeline can drive the implementation of the overall operation. For example, the even pipeline can process at least an initial portion of the read data for the even command. Also, the odd pipeline can process at least an initial portion of the read data for the odd command. The other (e.g., the remaining, the non-targeted, and/or the complementary) pipeline can process other or alternating portions of the read data according to a predetermined pattern.

At block 518, the apparatus 100 can coordinate operation implementations for the pipelines. The apparatus 100 can coordinate operation implementations by controlling a timing for initiating a process, such as by controlling enable signals that correspond to the operation. When two operations correspond to a timing requirement, such as the signal separation 416, the apparatus 100 (via, e.g., the coordination circuit 300 of FIG. 3 or a portion thereof) can control the enable signals according to the latency setting.

The apparatus 100 can control the enable signals based on the activated path described above. At block 520, the apparatus 100 can use the same internal clock associated with the target pipeline to coordinate the operations when the signal separation 416 corresponds to an even number of pulses. Otherwise, at block 522, the apparatus 100 can use different internal clocks, thereby crossing over pipelines, to coordinate the operations when the signal separation 416 corresponds to an odd number of pulses. As an example for the odd number of separating pulses, one operation (e.g., the DQS generation) and the corresponding enable (QES) can be implemented according to the other internal clock, such as the even internal clock for odd commands and the odd internal clock for even commands. The other time-restricted operation (e.g., the DQ generation) and the corresponding enable (QED) can be implemented according to the targeted internal clock (e.g., even internal clock for even commands, etc.).

In some embodiments, the coordination process can be implemented using a combining circuit (e.g., the even strobe-enable circuit 328 and/or the odd strobe-enable circuit 348 described above for FIG. 3) to combine the signals generated from different potential sources. In other words, the combining circuit can complete the cross-over and route the enable signals across the different pipelines (e.g., from the non-targeted pipeline to the target pipeline).

At block 524, the apparatus 100 can implement the first and second operations as coordinated. For example, the apparatus 100 can initiate the operations (e.g., the DQS and the DQ output) according to the enable signals (e.g., the QES and the QED, respectively).

Figure 6:
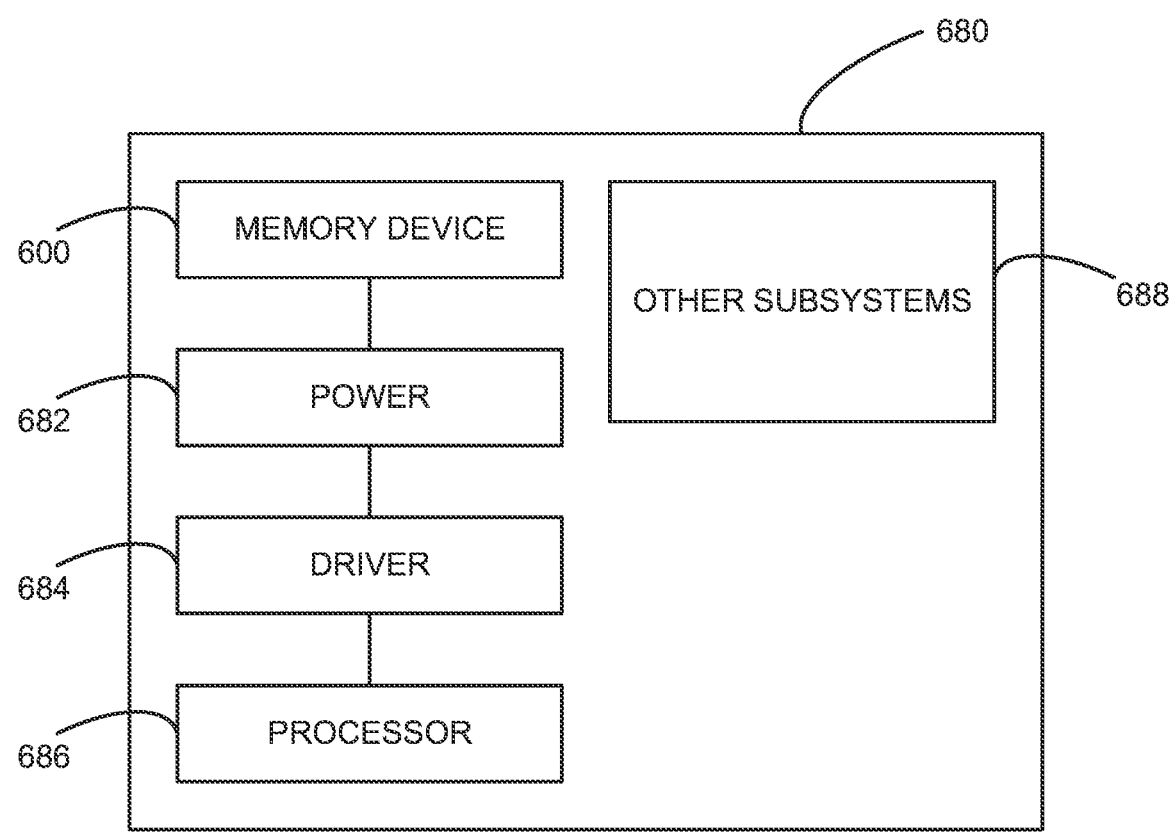
FIG. 6 is a schematic view of a system that includes an apparatus configured in accordance with embodiments of the present technology.

FIG. 6 is a schematic view of a system that includes an apparatus in accordance with embodiments of the present technology. Any one of the foregoing apparatuses (e.g., memory devices) described above with reference to FIGS. 1-5 can be incorporated into or implemented in memory (e.g., a memory device 600) or any of a myriad of larger and/or more complex systems, a representative example of which is system 680 shown schematically in FIG. 6. The system 680 can include the memory device 600, a power source 682, a driver 684, a processor 686, and/or other subsystems or components 688. The memory device 600 can include features generally similar to those of the apparatus described above with reference to FIGS. 1-5 and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-6.

We claim:

1. An apparatus, comprising:
an external clock circuit configured to receive an external clock having an external frequency, wherein the external clock is shared with an external device;
a set of pipelines coupled to the external clock circuit and configured to process data according to a command received according to the external clock, wherein
the set of pipelines includes an N number of pipelines, where N is integer greater than or equal to two, each configured to process 1/N portion of the data according to a corresponding internal clock having an internal frequency that is 1/N of the external frequency, and
processing the data includes implementing a first process and then a second process, wherein the second process follows the first process by a signal separation;
a latency control circuit coupled to the set of pipelines and configured to control implementation of the first and second processes according to a comparison between the signal separation and the N number of pipelines, wherein controlling the implementation corresponds to controlling initiations of the first and second processes according to the signal separation.

2. The apparatus of claim 1, wherein:
the external clock corresponds to a repeating pattern of N number of pulses, wherein each of the N number pulses corresponds to a unique one of the N number of pipelines;
each of the N number of pipelines is configured to process at least an initial portion of the data when the command is received on a corresponding pulse of the external clock; and
the latency control circuit is configured to use a circuit associated with a different pipeline to initiate the first process or the second process when the signal separation corresponds to a number of pulses that is not a factor of N, wherein the different pipeline corresponds to a pulse different than the pulse associated with the received command.

3. The apparatus of claim 1, wherein controlling initiations of the first and second processes includes controlling a first enable signal and a second enable signal, respectively.

4. The apparatus of claim 1, wherein:
N is two;
the external clock corresponds to alternating even and odd pulses and has the external frequency that is twice the internal frequency;
the set of pipelines includes (1) an even pipeline configured to process at least an initial portion of the data when the command is received on an even cycle of the external clock and (2) an odd pipeline configured to process at least the initial portion of the data when the command is received on an odd cycle of the external clock; and
when the signal separation corresponds to an odd number of cycles for the external clock, the latency control circuit is configured to use, in initiating the first process or the second process, (1) a circuit associated with the odd pipeline for the command received on the even cycle or (2) a circuit associated with the even pipeline for the command received on the odd cycle.

5. The apparatus of claim 4, wherein the latency control circuit is configured to:
   initiate the first process by generating a strobe enable signal to begin toggling a strobe signal; and
   initiate the second process by generating a data enable signal to coordinate a stream of data according to the strobe signal.

6. The apparatus of claim 5, wherein:
   the internal clocks include an even internal clock and an odd internal clock respectively aligned with the even and odd pulses of the external clock;
   the latency control circuit is configured to
      for the command received on the even cycle, generate (1) the strobe enable signal based on the odd internal clock and (2) the data enable signal based on the even internal clock, and
      for the command received on the odd cycle, generate (1) the strobe enable signal based on the even internal clock and (2) the data enable signal based on the odd internal clock.

7. The apparatus of claim 6, wherein the latency control circuit includes:
   an even enable generator circuit configured to respond to the command received on the even cycle and according to the even internal clock, the even enable generator circuit having
      a first even-latency circuit configured to generate a first even strobe enable signal for generating the strobe enable signal based on the even internal clock, and
      a first odd-latency circuit configured to generate a first odd strobe enable signal generating the strobe enable signal based on the odd internal clock; and
   an odd enable generator circuit configured to respond to the command received on the odd cycle and according to the odd internal clock, the odd enable generator circuit having
      a second even-latency circuit configured to generate a second odd strobe enable signal for generating the strobe enable signal based on the odd internal clock, and
      a second odd-latency circuit configured to generate a second even strobe enable signal for generating the strobe enable signal based on the even internal clock;
   wherein
   the latency control circuit is configured to select (1) one of the first even-latency circuit and the first odd-latency circuit and (2) one of the second odd-latency circuit and the second even-latency circuit, wherein the selection is made according to a latency setting that corresponds to the signal separation.

8. The apparatus of claim 7, wherein the latency control circuit is configured to select (1) the first even-latency circuit and the second even-latency circuit when the signal separation corresponds to an even number of cycles for the external clock or (2) the first odd-latency circuit and the second odd-latency circuit when the signal separation corresponds to an odd number of cycles for the external clock.

9. The apparatus of claim 7, wherein the latency control circuit includes:
   an even strobe enable circuit coupled to the first even-latency circuit and the second odd-latency circuit, the even strobe enable circuit configured to combine the first and second even strobe enable signals from the coupled circuits to generate a combined even strobe enable signal; and
   an odd strobe enable circuit coupled to the first odd-latency circuit and the second even-latency circuit, the odd strobe enable circuit configured to combine the first and second odd strobe enable signals from the coupled circuits to generate a combined odd strobe enable signal.

10. The apparatus of claim 9, wherein the even and odd strobe enable circuits each includes a multiplexer or an OR gate.

11. A memory device, comprising:
   an external clock circuit configured to receive an external clock having an external frequency, wherein the external clock represents alternating even and odd pulses;
   an even pipeline and an odd pipeline coupled to the external clock circuit, the even and odd pipelines each configured to process non-overlapping portions of data according to a received command and according to a corresponding internal clock having a frequency that is half of the external frequency, wherein
      the even pipeline is configured to (1) operate according to an even internal clock aligned with the even pulses of the external clock and (2) process at least an initial portion of the data when the command is received on an even cycle of the external clock, and
      the odd pipeline is configured to (1) operate according to an odd internal clock aligned with the odd pulses of the external clock and (2) process at least the initial portion of the data when the command is received on an odd cycle of the external clock; and
   a latency control circuit coupled to the even and odd pipelines and configured to selectively coordinate implementation of a first operation and a second operation in processing the data, wherein (1) one of the first and second operations is implemented using the even internal clock and (2) other of the first and second operations is implemented using the odd internal clock when a targeted delay between the first and second operations corresponds to an odd number of pulses of the external clock.

12. The memory device of claim 11, wherein:
   the received command is a read command;
   the first and second operations include generating a data strobe signal (DQS) and generating a read output (DQ), wherein the DQS precedes the DQ by a preamble length;
   the latency control circuit is configured to selectively coordinate implementation by generating (1) a strobe enable signal (QES) to activate the DQS and (2) a data enable signal (QED) to activate output of the DQ, wherein
      the QED is generated according to the even or the odd internal clock associated with the received clock pulse, and
      the QES is generated according to another of the even or the odd internal clock complementary to the received clock pulse when the targeted delay corresponds to an odd number of pulses.

13. The memory device of claim 12, wherein the latency control circuit is configured to use (1) a circuit associated with a target pipeline to generate the QED to begin generating the DQ through the target pipeline and (2) a circuit associated with a complementary pipeline to generate the QES to generate the DQS preceding the DQ by the odd number of pulses.

14. The memory device of claim 11, wherein the memory device comprises a Random-Access Memory (RAM).

15. A method of operating an apparatus, the method comprising:
   receiving a command;

identifying a received timing of the command as corresponding to an odd pulse or an even pulse in an external signal associated with communication of the command;

processing data in response to the command using an even pipeline and an odd pipeline, wherein
- the even and odd pipelines are each configured to process non-overlapping portions of the data according to corresponding internal clocks having a frequency that is half of an external frequency of the external signal,
- the even pipeline is configured to (1) operate according to an even internal clock aligned with the even pulses of the external signal and (2) process at least an initial portion of the data when the command is received on an even cycle of the external signal, and
- the odd pipeline is configured to (1) operate according to an odd internal clock aligned with the odd pulses of the external signal and (2) process at least the initial portion of the data when the command is received on an odd cycle of the external signal; and coordinating implementation of a first operation and a second operation in processing the data, wherein (1) one of the first and second operations is implemented using the even internal clock and (2) other of the first and second operations is implemented using the odd internal clock when a targeted delay between the first and second operations corresponds to an odd number of pulses of the external signal.

16. The method of claim 15, further comprising:

implementing the first operation by generating a data strobe signal (DQS);

implementing the second operation by generating a read output (DQ), wherein the DQS precedes the DQ by a preamble length;

wherein:

the received command is a read command;

coordinating the implementation includes generating (1) a strobe enable signal (QES) to activate the DQS and (2) a data enable signal (QED) to activate output of the DQ, wherein the QED is generated according to the even or the odd internal clock associated with the received clock pulse, and the QES is generated according to another of the even or the odd internal clock complementary to the received clock pulse when the targeted delay corresponds to an odd number of pulses.

17. The method of claim 16, wherein, when the targeted delay corresponds to an odd number of pulses and when the read command is received on an even clock pulse, coordinating the implementation includes:

generating the QED according to the even internal clock; and generating the QES according to the odd internal clock.

18. The method of claim 15, wherein coordinating the implementation includes using different pipelines to at least initiate the first and second operations when the targeted delay corresponds to an odd number of pulses.

19. The method of claim 15, further comprising:

determining a latency setting representative of the targeted delay;

selecting an even-latency circuit or an odd-latency circuit for each pipeline based on the latency setting, the even-latency and odd-latency circuits are each configured to generate an enable signal for implementing one of the first and second operations according to the internal clock associated with the corresponding pipeline, wherein:
- the even-latency circuit is configured to generate the enable signal for the corresponding pipeline when the targeted delay corresponds to an even number of clock pulses; and
- the odd-latency circuit is configured to generate the enable signal for a complementary pipeline when the targeted delay corresponds to an odd number of clock pulses.

20. The method of claim 19, wherein coordinating the implementation includes routing the enable signal from the complementary pipeline to the corresponding pipeline when the targeted delay corresponds to an odd number of clock pulses.

* * * * *